(12) United States Patent
Hsu et al.

(10) Patent No.: US 12,222,783 B2
(45) Date of Patent: Feb. 11, 2025

(54) ELECTRONIC DEVICE

(71) Applicant: Getac Technology Corporation, New Taipei (TW)

(72) Inventors: Wan-Lin Hsu, Taipei (TW); Juei-Chi Chang, Taipei (TW); Hung-Chan Cheng, Taipei (TW)

(73) Assignee: GETAC TECHNOLOGY CORPORATION, New Taipei (TW)

( * ) Notice: Subject to any disclaimer, the term of this patent is extended or adjusted under 35 U.S.C. 154(b) by 217 days.

(21) Appl. No.: 18/150,958

(22) Filed: Jan. 6, 2023

(65) Prior Publication Data
US 2023/0259183 A1    Aug. 17, 2023

Related U.S. Application Data

(60) Provisional application No. 63/351,422, filed on Jun. 12, 2022, provisional application No. 63/309,463, filed on Feb. 11, 2022.

(30) Foreign Application Priority Data

Nov. 22, 2022 (CN) .......................... 202211474353.6

(51) Int. Cl.
*G06F 1/20* (2006.01)
*H05K 7/14* (2006.01)
*H05K 7/20* (2006.01)

(52) U.S. Cl.
CPC ........... *G06F 1/203* (2013.01); *H05K 7/1407* (2013.01); *H05K 7/20154* (2013.01);
(Continued)

(58) Field of Classification Search
CPC ...... G06F 1/203; G06F 1/1616; G06F 1/1656; G06F 1/1658; G06F 1/183; H05K 7/1407;
(Continued)

(56) References Cited

U.S. PATENT DOCUMENTS 6,304,441 B1 * 10/2001 Han ..................... H01L 23/3672
361/679.48
10,831,247 B2 * 11/2020 Uchino ................... F28F 3/025
(Continued)

FOREIGN PATENT DOCUMENTS

CN         104780735 B     4/2018
CN         208674101 U     3/2019
(Continued)

*Primary Examiner* — Stephen S Sul
(74) *Attorney, Agent, or Firm* — McClure, Qualey & Rodack, LLP

(57) ABSTRACT

An electronic device includes a housing and a first heat source, a second heat source, and a heat dissipation module that are disposed in the housing. The heat dissipation module includes a first fan, a second fan, a first heat conduction member, and a second heat conduction member. The first fan and the second fan are disposed on two opposite sides of the housing. One end of the first heat conduction member is disposed at the first fan, and the other end is located at a position on a side of an upper surface of the housing corresponding to the first heat source. One end of the second heat conduction member is disposed at the second fan, and the other end is located on a side of a lower surface of the housing and abuts against the second heat source.

20 Claims, 9 Drawing Sheets

(52) U.S. Cl.
CPC ..... *H05K 7/20172* (2013.01); *H05K 7/20436* (2013.01); *H05K 7/205* (2013.01)

(58) Field of Classification Search
CPC .......... H05K 7/20154; H05K 7/20172; H05K 7/20436; H05K 7/205
See application file for complete search history.

(56) References Cited

U.S. PATENT DOCUMENTS

| | | |
|---|---|---|
| 10,851,800 B2 | 12/2020 | He et al. |
| 2008/0019093 A1* | 1/2008 | Hongo ..................... G06F 1/203 361/693 |
| 2008/0037227 A1* | 2/2008 | Fujiwara ................. G06F 1/203 361/722 |
| 2010/0002388 A1 | 1/2010 | Tanaka |
| 2011/0026223 A1 | 2/2011 | Kaneko |
| 2012/0015530 A1 | 1/2012 | Tatsukami |
| 2012/0075804 A1 | 3/2012 | Chen |
| 2012/0194995 A1 | 8/2012 | Wang et al. |
| 2019/0121398 A1 | 4/2019 | Huang et al. |
| 2021/0216120 A1 | 7/2021 | Kitamura et al. |
| 2021/0321533 A1 | 10/2021 | Chen |
| 2022/0229477 A1* | 7/2022 | Chen ....................... G06F 1/203 |
| 2023/0079287 A1* | 3/2023 | Kitamura ............... G06F 1/1669 361/679.09 |
| 2023/0200013 A1* | 6/2023 | Sano .................. H05K 7/20336 361/689 |

FOREIGN PATENT DOCUMENTS

| | | |
|---|---|---|
| CN | 114025578 A | 2/2022 |
| TW | I246394 B | 12/2005 |
| TW | M292257 U | 6/2006 |
| TW | I749942 B | 12/2021 |

* cited by examiner

ELECTRONIC DEVICE

CROSS-REFERENCES TO RELATED APPLICATIONS

This application claims the benefit of US provisional application Ser. No. 63/309,463, filed on Feb. 11, 2022, U.S. provisional application Ser. No. 63/351,422, filed on Jun. 12, 2022, and claims the priority of Patent Application No. 202211474353.6 filed in China, P.R.C. on Nov. 22, 2022. The entirety of the above-mentioned patent applications are hereby incorporated by references herein and made a part of the specification.

BACKGROUND OF THE INVENTION

The present invention relates to an electronic device.

With the popularization of electronic devices, users have higher and higher requirements for the performance of electronic devices, and the number of electronic components in electronic devices is increasing. The requirement of heat dissipation inside electronic devices is becoming more and more important to prevent electronic components from overheating to ensure normal operation. However, with the increase in the number of electronic components in electronic devices, the applicant urgently needs to mitigate the problem that it is difficult to find an optimal balance between space configuration and heat dissipation efficiency.

SUMMARY OF THE INVENTION

The present invention provides an electronic device, including a housing, a first heat source, a second heat source, and a heat dissipation module. The housing includes a first case and a second case. The first case includes an upper surface and a lower surface that are opposite to each other, a through hole, and a side wall, where the through hole runs through the upper surface and the lower surface, and the side wall extends away from the upper surface along a contour of the lower surface. The second case is disposed at an end of the side wall away from the upper surface. The first heat source is disposed in the housing and corresponds to the through hole. The second heat source is disposed in the housing. The heat dissipation module includes a first fan, a second fan, a first heat conduction member, and a second heat conduction member. The first fan includes a first air outlet, where the first fan is disposed on one side of the first case. The second fan includes a second air outlet, where the second fan is disposed on the other side of the first case and is adjacent to the second heat source, and the first air outlet and the second air outlet are located on two opposite sides of the side wall. One end of the first heat conduction member is disposed at the first fan, and the other end is located at a position on a side of the upper surface corresponding to the first heat source. One end of the second heat conduction member is disposed at the second fan, and the other end is located on a side of the lower surface and abuts against the second heat source.

In some embodiments, the first case further includes two partition walls, the two partition walls are disposed on the lower surface and define two non-waterproof areas and one waterproof area with the side wall respectively, and both the first heat source and the second heat source are located in the waterproof area.

In some embodiments, the first fan and the second fan are respectively located in the two non-waterproof areas.

In some embodiments, the first case further includes a penetrating hole and a groove, the penetrating hole runs through the upper surface and the lower surface, the groove is provided in the upper surface and is in communication with the penetrating hole and the through hole, the first heat conduction member is disposed in the groove, a position of one end of the first heat conduction member corresponds to the penetrating hole, and the other end is located in the through hole.

In some embodiments, the electronic device further includes two heat dissipation fin sets, where one heat dissipation fin set is disposed in the penetrating hole and is located at the first air outlet of the first fan, and the other heat dissipation fin set is disposed at the second air outlet of the second fan.

In some embodiments, the end of the first heat conduction member disposed at the first fan abuts against one heat dissipation fin set, and the end of the second heat conduction member disposed at the second fan abuts against the other heat dissipation fin set.

In some embodiments, the second case includes a main frame and a plate member, the main frame is connected to the side wall, and the plate member is detachably disposed on the main frame.

In some embodiments, a position of the plate member corresponds to a position of the first fan.

In some embodiments, a position of the plate member corresponds to positions of the second heat source and the second fan.

In some embodiments, the plate member is provided with a plurality of heat dissipation holes.

In some embodiments, the electronic device further includes an input device, where the input device is disposed on the upper surface and covers the first heat source and the first heat conduction member.

In some embodiments, the electronic device further includes a circuit board, where the first heat source and the second heat source are respectively located on two opposite sides of the circuit board.

In some embodiments, the heat dissipation module further includes a heat conduction plate, the heat conduction plate includes a first surface and a second surface configured oppositely, the heat conduction plate is disposed in the through hole, the first heat conduction member abuts against the first surface, and the first heat source abuts against the second surface.

In some embodiments, the electronic device further includes a combination unit, where the circuit board is combined with the heat conduction plate through the combination unit.

In some embodiments, the combination unit includes a combination member and a locking member, the combination member includes a fixed section and a cantilever section that are joined, the fixed section is fixed on the second surface, and the locking member runs through the circuit board and is locked on the cantilever section.

In some embodiments, the combination unit further includes a nut, disposed at an end of the cantilever section away from the fixed section, and the locking member runs through the circuit board and is locked on the nut.

In some embodiments, the combination member has a long strip structure, and the combination member includes two cantilever sections, respectively joined to two ends of the fixed section.

In some embodiments, two combination members are provided, and the two combination members are disposed in parallel on the heat conduction plate.

The present invention provides another electronic device, including a housing, a circuit board, a first heat source, a heat dissipation module, and a combination unit. The circuit board is disposed in the housing. The first heat source is disposed on the circuit board. The heat dissipation module includes a first fan, a heat conduction plate, and a first heat conduction member. The first fan is disposed in the housing. The heat conduction plate includes a first surface and a second surface configured oppositely, where the second surface abuts against the first heat source. One end of the first heat conduction member is disposed at the first fan, and the other end abuts against the first surface of the heat conduction plate. The combination unit includes a combination member and a locking member. The combination member includes a fixed section and a cantilever section that are joined, the fixed section is fixed on the second surface of the heat conduction plate, and the locking member runs through the circuit board and is locked on the cantilever section.

In some embodiments, the combination unit further includes a nut, disposed at an end of the cantilever section away from the fixed section, and the locking member runs through the circuit board and is locked on the nut.

DETAILED DESCRIPTION OF THE INVENTION

Figure 1:
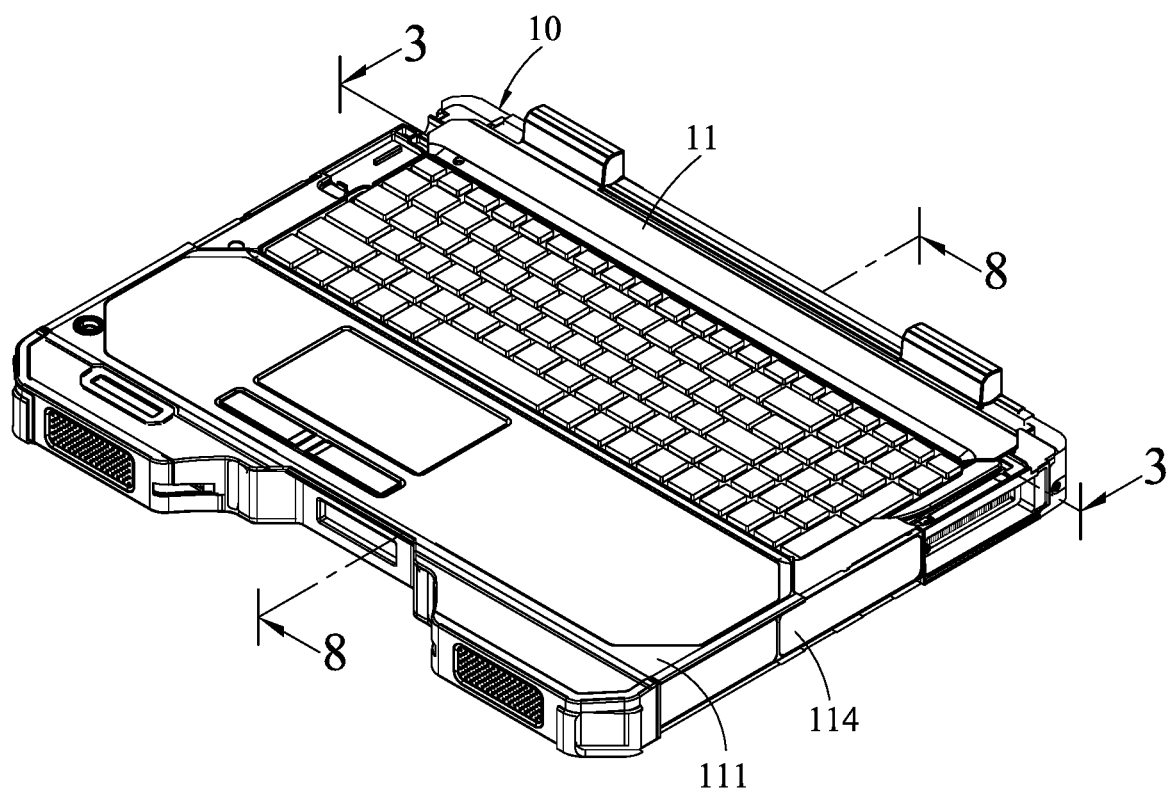
FIG. 1 is a schematic three-dimensional outside view of an embodiment of an electronic device according to the present invention.
Figure 2:
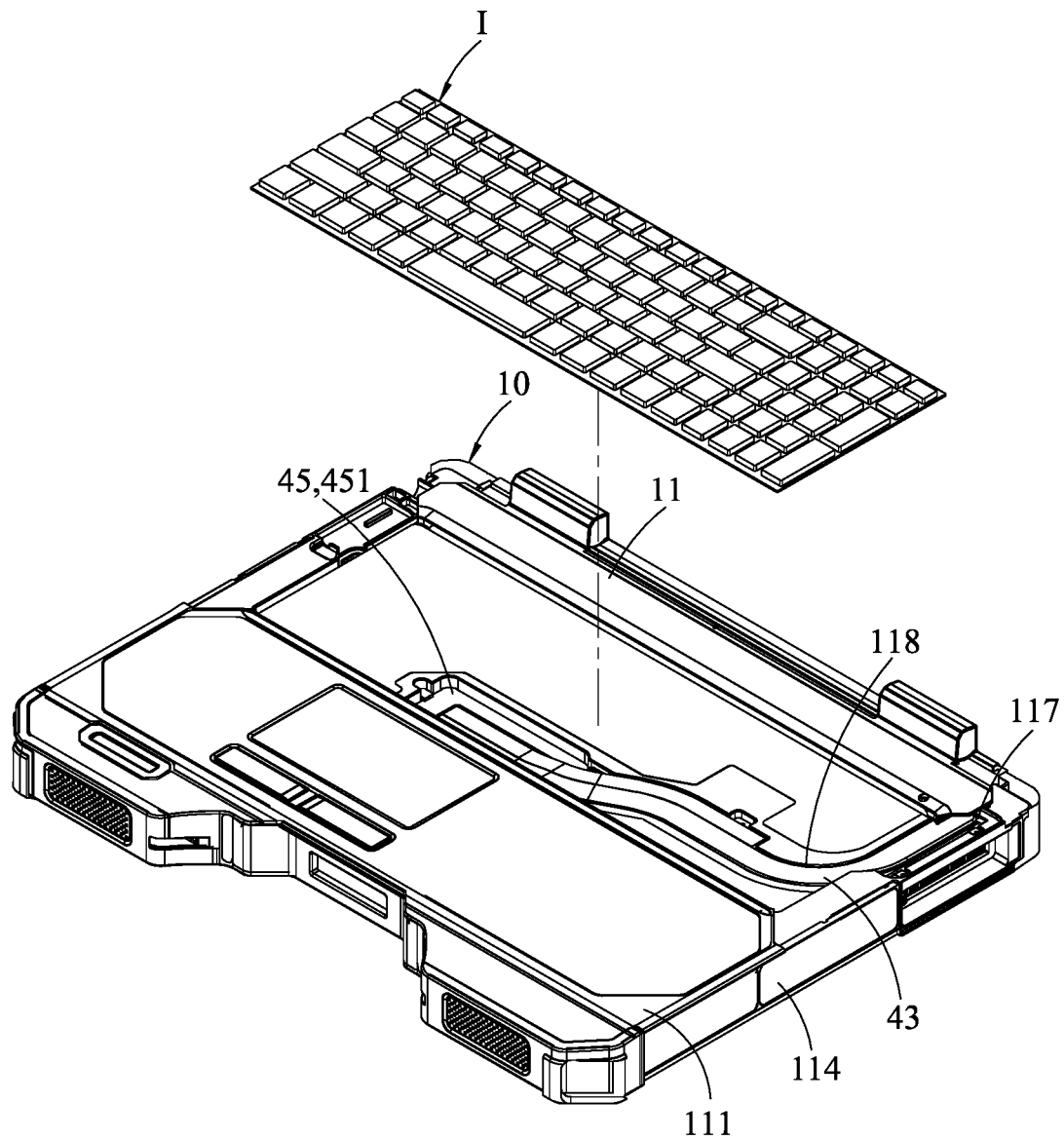
FIG. 2 is a partial schematic structural exploded view of an embodiment of an electronic device according to the present invention.
Figure 3:
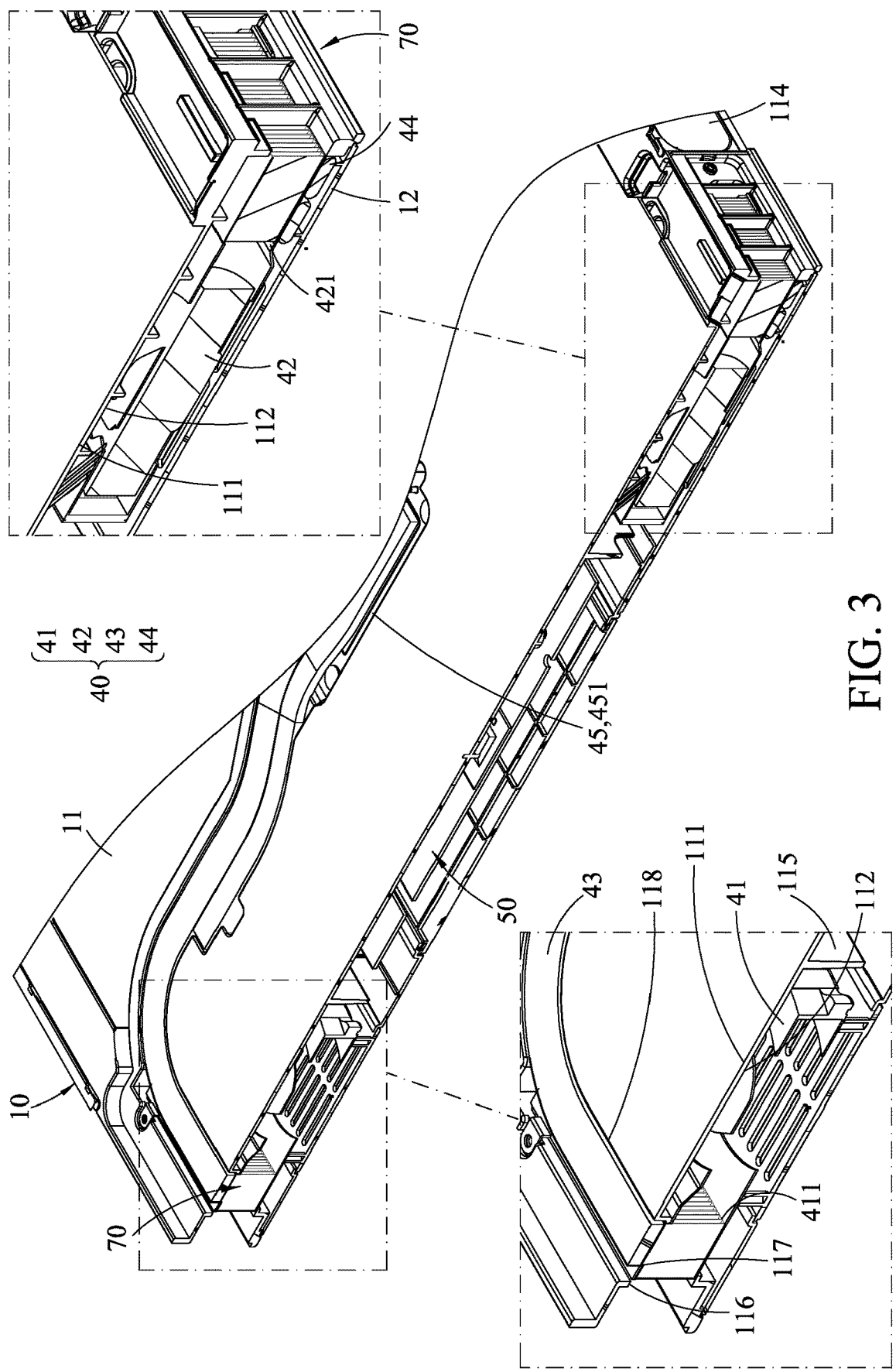
FIG. 3 is a partial schematic three-dimensional cross-sectional view drawn along a cutting line 3-3 in FIG. 1.
Figure 4:
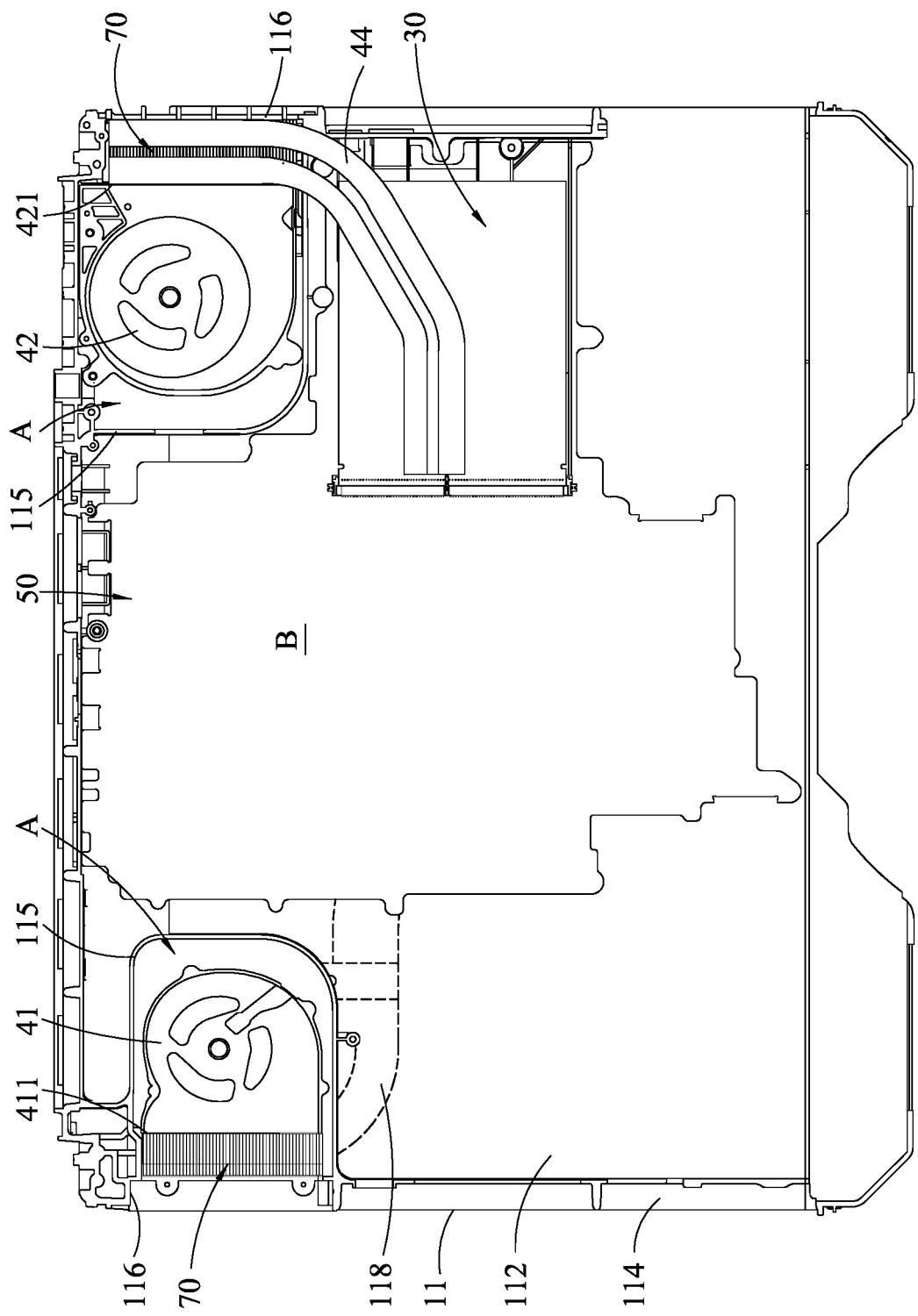
FIG. 4 is a first partial schematic structural planar view of an embodiment of an electronic device according to the present invention.
Figure 5:
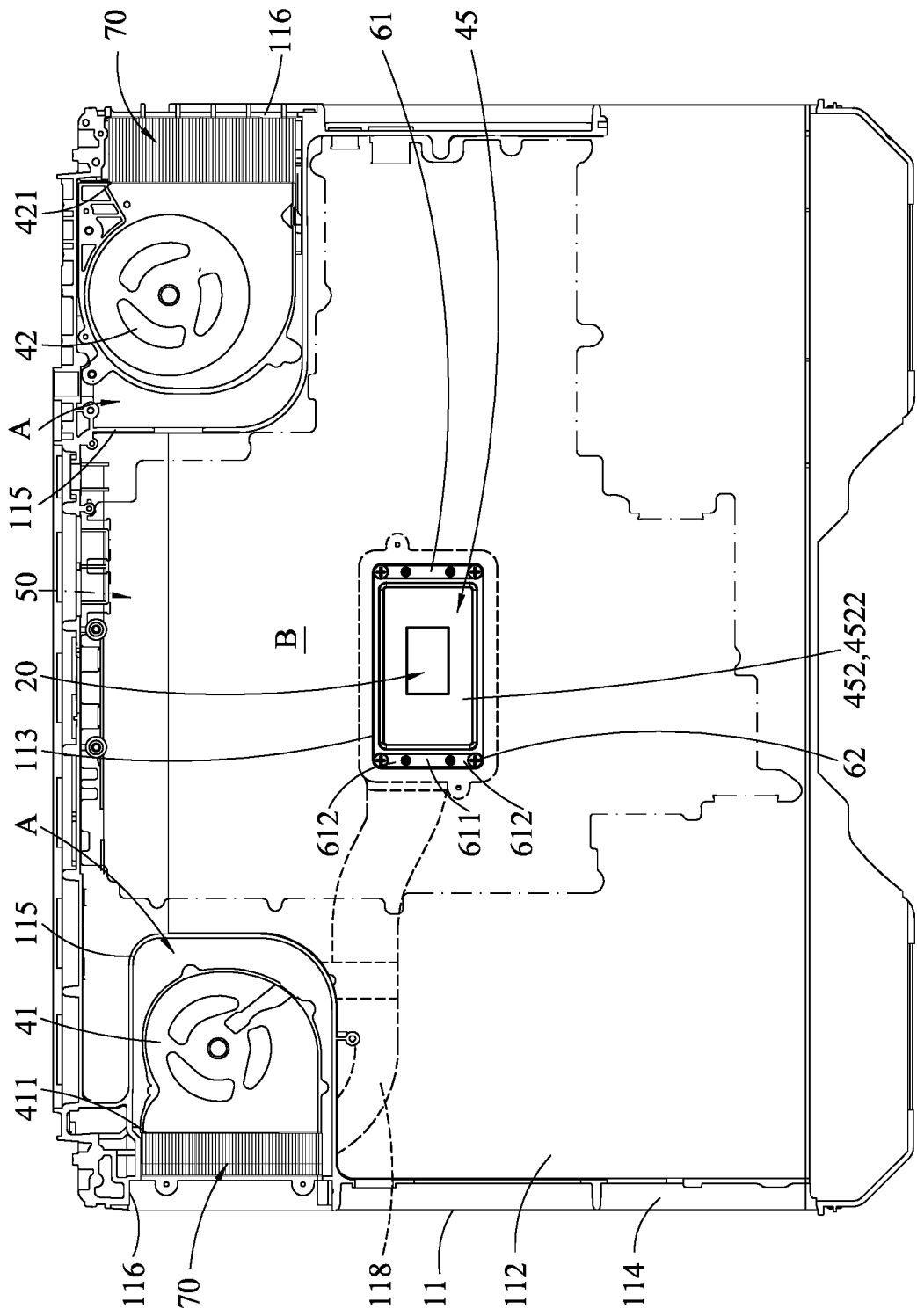
FIG. 5 is a second partial schematic structural planar view of an embodiment of an electronic device according to the present invention.

Refer to FIG. 1 to FIG. 5. FIG. 1 is a schematic three-dimensional outside view of an embodiment of an electronic device according to the present invention. FIG. 2 is a partial schematic structural exploded view of an embodiment of an electronic device according to the present invention. FIG. 3 is a partial schematic three-dimensional cross-sectional view drawn along a cutting line 3-3 in FIG. 1. FIG. 4 is a first partial schematic structural planar view of an embodiment of an electronic device according to the present invention. FIG. 5 is a second partial schematic structural planar view of an embodiment of an electronic device according to the present invention.

The electronic device of the present invention includes a housing 10 and a first heat source 20, a second heat source 30, and a heat dissipation module 40 that are disposed in the housing 10. The housing 10 includes a first case 11 and a second case 12. The first case 11 includes an upper surface 111 and a lower surface 112 that are opposite to each other, a through hole 113, and a side wall 114. The through hole 113 runs through the upper surface 111 and the lower surface 112. The side wall 114 extends away from the upper surface 111 along a contour of the lower surface 112. The second case 12 is disposed at an end of the side wall 114 away from the lower surface 112 of the first case 11. The first heat source 20 is disposed at a position corresponding to the through hole 113. The heat dissipation module 40 includes a first fan 41, a second fan 42, a first heat conduction member 43, and a second heat conduction member 44. The first fan 41 includes a first air outlet 411. The first fan 41 is disposed on one side of the first case 11. The second fan 42 includes a second air outlet 421. The second fan 42 is disposed on the other side of the first case 11 and is adjacent to the second heat source 30. The first air outlet 411 and the second air outlet 421 are located on two opposite sides of the side wall 114. One end of the first heat conduction member 43 is disposed at the first fan 41. The other end of the first heat conduction member 43 is located at a position on a side of the upper surface 111 and corresponding to the first heat source 20. One end of the second heat conduction member 44 is disposed at the second fan 42. The other end of the second heat conduction member 44 is located on a side of the lower surface 112 and abuts against the second heat source 30.

In this way, the heat dissipation module 40 can fully provide heat dissipation for the first heat source 20 and the second heat source 30 located at different positions in a limited space in the housing 10, and improve position configuration freedom of the first heat source and the second heat source 30 in the housing 10. In addition, since the first air outlet 411 of the first fan 41 and the second air outlet 421 of the second fan 42 are located on the opposite sides of the side wall 114, when the first heat conduction member 43 and the second heat conduction member 44 are disposed at the first fan 41 and the second fan 42, the first heat source 20 and the second heat source 30 may be configured at different positions in the housing 10 according to the positions of the first heat conduction member 43 and the second heat conduction member 44, which can effectively improve heat dissipation efficiency and improve space utilization in the housing 10.

Referring to FIG. 1 to FIG. 3, the electronic device of the present invention is a device internally provided with electronic components that generate heat due to operation. In some embodiments, the electronic device is a notebook computer, but the present invention is not limited thereto. In these embodiments, the housing 10 is a main housing of the notebook computer. The first case 11 is a C member configured to mount an input device I. The second case 12 is a D member supported on a use surface. In this embodiment, the input device I is disposed on the upper surface 111 of the first case 11 and covers the through hole 113. A space is formed between the second case 12, the lower surface 112 of the first case 11, and the side wall 114 for accommodating the first heat source 20, the second heat source 30, and the heat dissipation module 40.

Refer to FIG. 3 to FIG. 5. FIG. 4 is a schematic diagram of an embodiment of an electronic device with the second case 12 omitted and drawn from a viewing angle perpendicular to the lower surface 112 of the first case 11 according to the present invention. FIG. 5 is a schematic perspective view of a circuit board 50 with the second heat source 30 and the second heat conduction member 44 further omitted based on FIG. 4.

In some embodiments, the first case 11 includes two partition walls 115 and a plurality of air flow channels 116. The air flow channels 116 are provided passing through the side wall 114. In these embodiments, each partition wall 115 is disposed on the lower surface 112, and extends from the lower surface 112 in a direction away from the upper surface 111. In this embodiment, two ends of each partition wall 115 are joined to the side wall 114. The air flow channels 116 are respectively located within ranges of the two ends of the partition wall 115. In this way, each partition wall 115, part of the side wall 114 provided with the air flow channels 116, and the second case 12 respectively define two non-waterproof areas A, and the two partition walls 115, the rest of the side wall 114, and the second case 112 define one waterproof area B.

In these embodiments, the first fan 41 and the second fan 42 are respectively located in the non-waterproof areas A and discharge air through the air flow channels 116. The first heat source 20 and the second heat source 30 can be disposed in the waterproof area B, to ensure smooth air flow of heat dissipation of the first fan 41 and the second fan 42, thereby ensuring a heat dissipation effect and also ensuring the waterproofness of the first heat source 20 and the second heat source 30 that are located in the housing 10, to avoid affecting the operation of the first heat source 20 and the second heat source 30.

Referring to FIG. 3 to FIG. 5, in this embodiment, the first case 11 further includes a penetrating hole 117 and a groove 118. The penetrating hole 117 runs through the upper surface 111 and the lower surface 112 and is in communication with the non-waterproof area A provided with the first fan 41. The groove 118 is provided in the upper surface 111 and is in communication with the penetrating hole 117 and the through hole 113. It should be noted that, in FIG. 4 and FIG. 5, a contour drawn by a dotted line is a contour line of the groove 118 depressed by the upper surface 111 of the first case 11, part of the groove 118 corresponds to the shape of the first heat conduction member 43, and the rest is in communication with the through hole 113 and corresponds to the shape of a heat conduction plate 45. In this way, the first heat conduction member 43 is disposed in the groove 118. A position of one end of the first heat conduction member 43 corresponds to the through hole 113 to absorb heat energy generated by the first heat source 20, and the other end of the first heat conduction member 43 is located in the penetrating hole 117 to correspond to the first fan 41, to quickly guide out the heat energy on the first heat conduction member 43 through an air flow generated by the first fan 41.

The input device I covers all the heat conduction plate 45, the penetrating hole 117, the first heat conduction member 43, and the groove 118 from above, so that the first heat conduction member 43 and the heat conduction plate 45 are located between the input device I and the upper surface 111 of the first case 11, and a user of the electronic device is kept from directly touching the first heat conduction member 43 and the heat conduction plate when using the electronic device, thereby improving safety and comfort in use.

Figure 6:
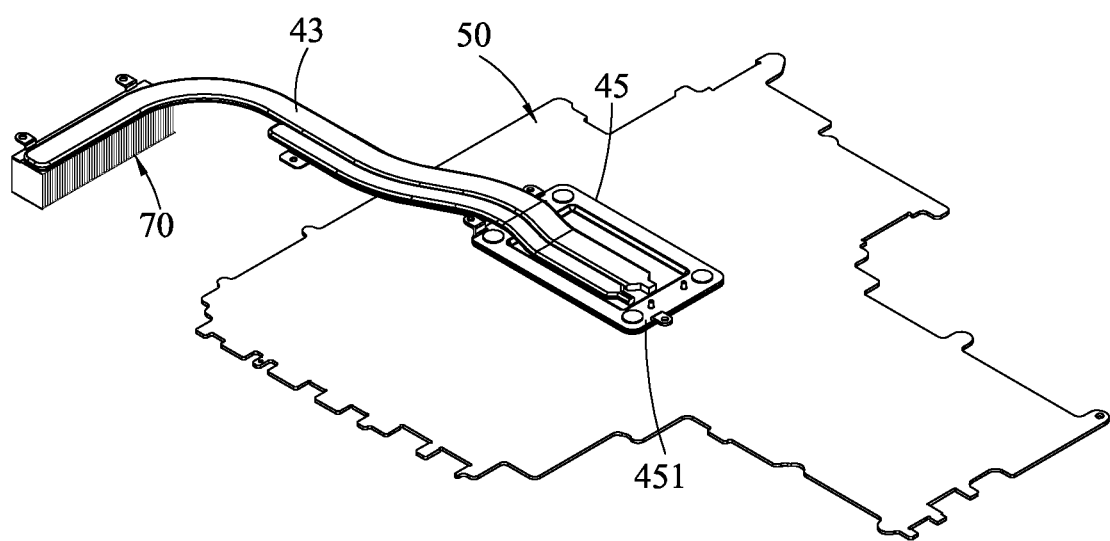
FIG. 6 is a partial schematic structural three-dimensional view of an electronic device according to the present invention.
Figure 7:
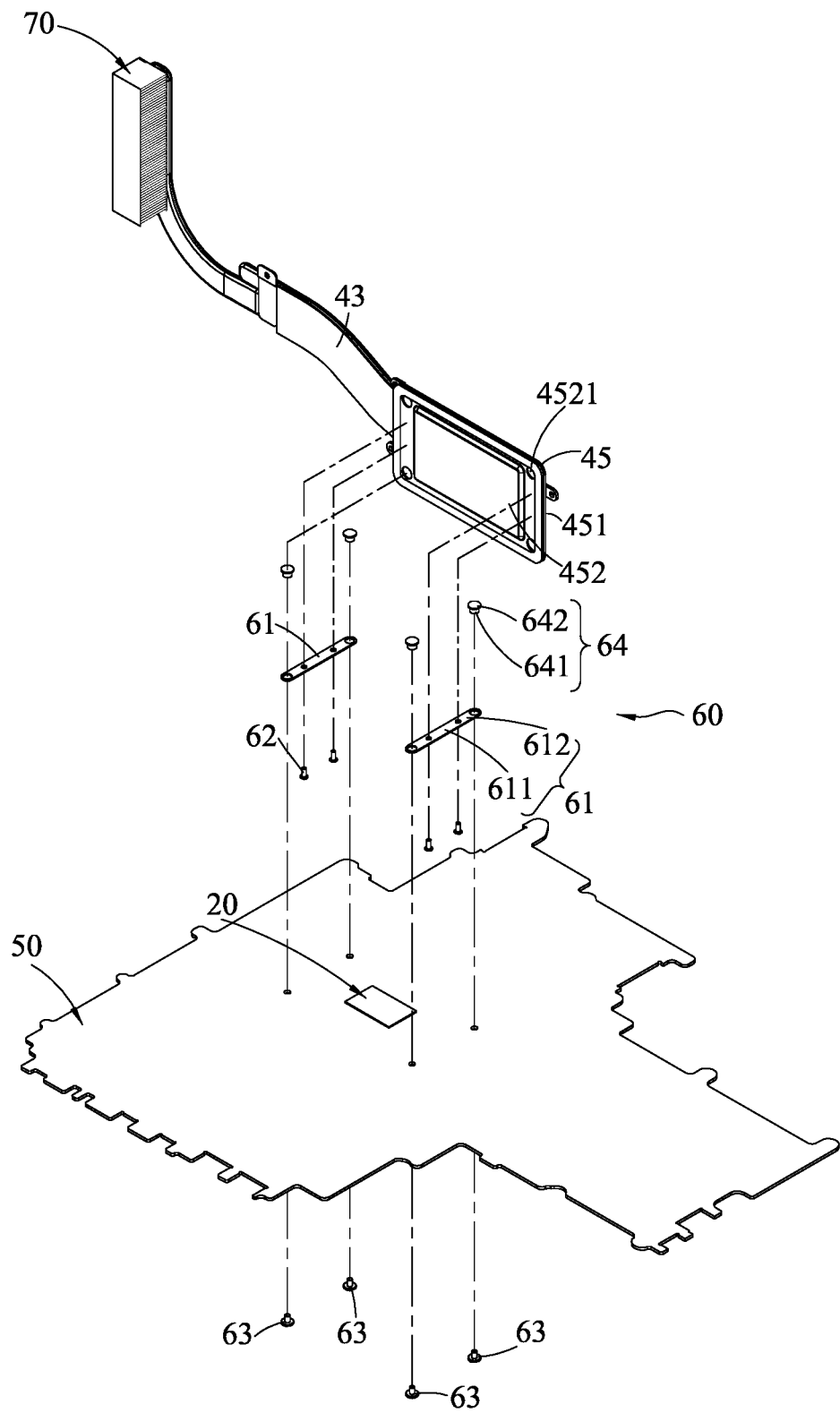
FIG. 7 is a schematic exploded view of FIG. 6.

Refer to FIG. 3 to FIG. 7. FIG. 6 is a partial schematic structural three-dimensional view of an electronic device of the present invention. FIG. 7 is a schematic exploded view of FIG. 6. In this embodiment, the heat dissipation module 40 further includes a heat conduction plate 45. The heat conduction plate 45 is disposed between the first heat source 20 and the first heat conduction member 43. Through the heat conduction plate 45 with a large-area contact between the first heat conduction member 43 and the first heat source 20, heat of the first heat source 20 can be quickly transferred to the first heat conduction member 43, thereby improving a heat conduction effect of the first heat conduction member 43. In these embodiments, the heat conduction plate 45 is a plate-shaped body with an area greater than that of the first heat source 20. In some embodiments, the heat conduction plate 45 is a copper sheet with a high thermal conductivity coefficient, but the present invention is not limited thereto.

Referring to FIG. 2 to FIG. 7, in some embodiments in which the heat dissipation module 40 includes the heat conduction plate 45, the area of the heat conduction plate 45 is greater than that of the through hole 113. As shown in FIG. 2, the heat conduction plate 45 completely covers the through hole 113. The heat conduction plate 45 includes a first surface 451 and a second surface 452 configured oppositely. The heat conduction plate 45 is disposed on the upper surface 111 of the first case 11, covers the through hole 113 with the second surface 452, and abuts against the upper surface 111 around the through hole 113. The first heat conduction member 43 abuts against the first surface 451 of the heat conduction plate 45. The first heat source 20 is disposed at a position corresponding to the through hole 113 in the housing 10 and abuts against the second surface 452.

In this way, the heat conduction plate 45 abuts against the upper surface 111 of the first case 11 to be stably supported and can contact the first heat source 20 at the same time. In these embodiments, the second surface 452 of the heat conduction plate 45 further includes a convex portion 4522. The shape and size of the convex portion 4522 are smaller than those of the through hole 113. When the second surface 452 of the heat conduction plate abuts against the upper surface 111 of the first case 11, the convex portion 4522 of the heat conduction plate 45 penetrates into the through hole 113, to exactly abut against the first heat source 20 located in the first case 11.

In these embodiments, the shape of the groove 118 in communication between the through hole 113 and the penetrating hole 117 corresponding to the position of the through hole 113 corresponds to the shape of the heat conduction plate 45, so that the heat conduction plate 45 can be assembled more easily and can be stably accommodated in the groove 118 to correspond to the through hole 113 and the first heat source 20. In this way, it is also more convenient to fix the heat conduction plate 45 on the upper surface 111 of the first case 11 by various fixing means. As shown in FIG. 5, an outer periphery of the heat conduction plate 45 is fixed to the first case 11 by a screw locking member.

Referring to FIG. 3 to FIG. 5, in some embodiments, the electronic device further includes a circuit board 50. The circuit board 50 is disposed in the housing 10 in a direction parallel to the lower surface 112. The first heat source 20 and the second heat source 30 are respectively located on two opposite sides of the circuit board 50. The first heat source 20 and the second heat source 30 are respectively disposed at different height positions in the housing 10. In these embodiments, the first heat source 20 is disposed on a side of the circuit board 50 close to the lower surface 112, and the second heat source 30 is disposed on a side of the circuit board 50 away from the lower surface 112. In this way, the first heat source 20 and the second heat source 30 may be located at different height positions in the housing 10. The first heat source 20 and the first fan 41 and the first heat conduction member 43 that are configured to dissipate heat from the first heat source 20 may be as close as possible to the upper surface 111 of the first case 11. The second heat conduction member 44 configured to dissipate heat from the second heat source 30 may be configured at a position close to the second case 12, so that heat from the first heat source 20 and the second heat source 30 at different height positions is fully dissipated through the heat dissipation module 40, and the space utilization in the housing 10 can be improved. In some embodiments, the first heat source 20 and the second heat source 30 may be respectively, for example, a central processing unit or a display card, but the present invention is not limited thereto. In some embodiments, the first heat conduction member 43 and the second heat conduction member 44 are, for example, heat pipes or flat copper tubes with a high thermal conductivity coefficient, but the present invention is not limited thereto.

Figure 8:
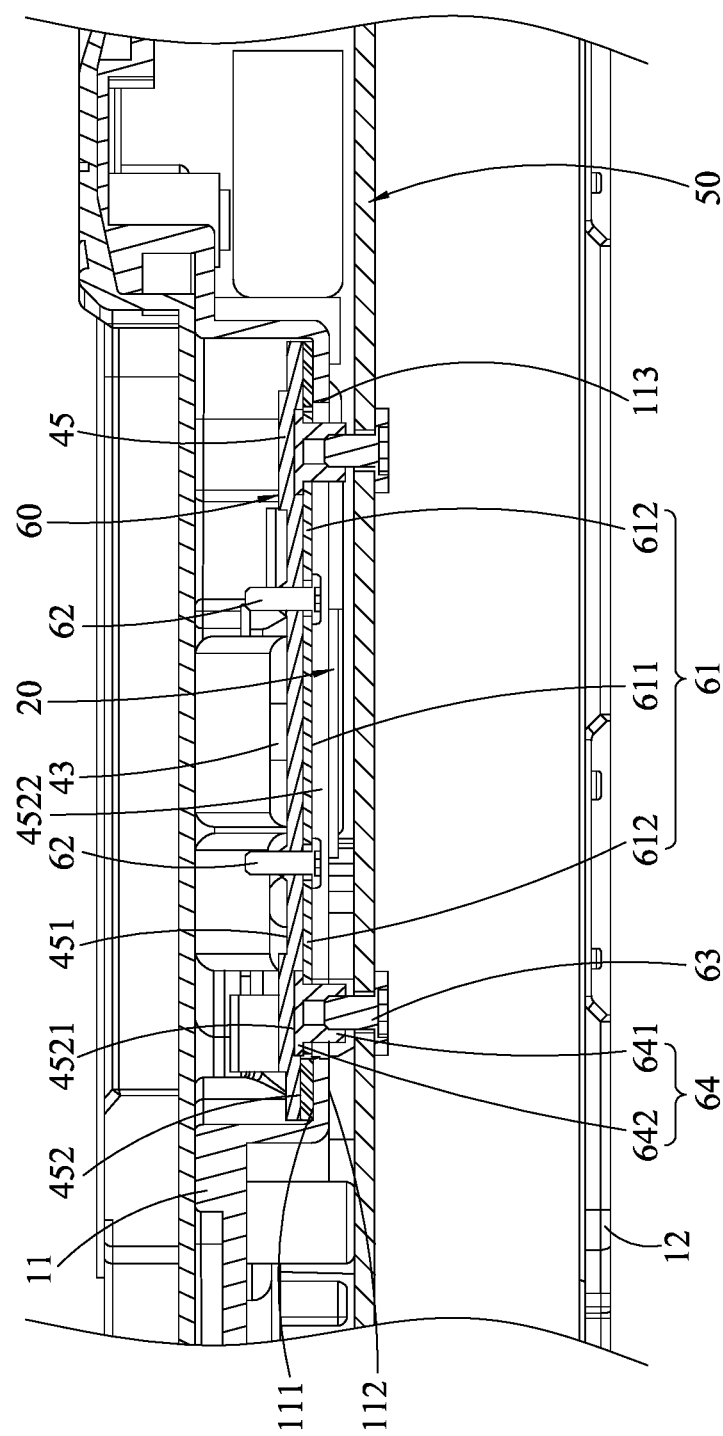
FIG. 8 is a partial cross-sectional view drawn along a cutting line 8-8 in FIG. 1.

Refer to FIG. 5 to FIG. 8. FIG. 8 is a partial cross-sectional view drawn along a cutting line 8-8 in FIG. 1. In this embodiment, the electronic device further includes a combination unit 60 to combine the heat conduction plate 45 and the circuit board 50, to ensure that the heat conduction plate 45 can exactly contact the first heat source 20 on the circuit board 50 under a predetermined pressure. In these embodiments, the circuit board 50 is not directly combined with the heat conduction plate 45, but is combined with the heat conduction plate 45 through the combination unit 60. In this embodiment, a relative position of the circuit board 50 relative to the heat conduction plate 45 is restrained by the combination unit 60 fixed on the heat conduction plate 45.

Referring to FIG. 5 to FIG. 8, in this embodiment, the combination unit 60 includes a combination member 61, a fixing member 62, and a locking member 63. The combination member 61 includes a fixed section 611 and a cantilever section 612 that are joined. The fixing member 62 fixes the combination member 61 on the second surface 452 of the heat conduction plate 45 and defines the fixed section 611. Two ends of fixed section 611 define the cantilever section 612 respectively. The locking member 63 runs through the circuit board 50 and is locked to the cantilever section 612. In this way, since one end of the cantilever section 612 is connected to the fixed section 611 and the other end is a free end, when the locking member 63 is locked to the circuit board 50 by the cantilever section 612, the end of the cantilever section 612 connected to the fixed section 611 limits the cantilever section 612 and a locking depth of the locking member 63 locked on the cantilever section 612. The cantilever section 612 is limited by the fixed section 611 and can restrain the locking member 63 to prevent the circuit board 50 from damage due to an excessive locking force of the locking member 63.

Referring to FIG. 5 to FIG. 8, in some embodiments, the fixing member 62 of the combination unit 60 can be, but is not limited to, a rivet or a screw locking member. In these embodiments, two fixing members 62 are provided. The two fixing members 62 are disposed at a middle section of the combination member 61 and fixed to the heat conduction plate 45. A range between the two fixing members 62 defines the fixed section 611. A range between each fixing member 62 and two free ends of the combination member 61 is defined as the cantilever section 612.

Referring to FIG. 4 to FIG. 7, in this embodiment, the combination unit 60 is provided with two combination members 61. Each combination member 61 has a long strip structure. The two combination members 61 are disposed on the second surface 452 of the heat conduction plate 45. In this embodiment, the two combination members 61 are parallel to each other and are located on two opposite sides of the through hole 113. In these embodiments, each combination member 61 is provided with two cantilever sections 612. The cantilever sections 612 are respectively joined to two ends of the fixed section 611. In this way, the combination unit 60 can use four locking members 63 to lock the circuit board 50 to the combination member 61 fixed on the heat conduction plate 45. The locking members 63 may be disposed at a position corresponding to four corners of the through hole 113, to improve the locking stability between the combination unit 60 and the circuit board 50.

Referring to FIG. 5 to FIG. 8, in some embodiments, the combination unit 60 further includes a nut 64, disposed at an end of the cantilever section 612 away from the fixed section 611. The locking member 63 runs through the circuit board 50 and is locked to the nut 64, to facilitate the locking of the locking member 63. In some embodiments in which the combination unit 60 includes a nut 64, the nut 64 includes a sleeve portion 641 and a head portion 642 that are joined. The sleeve portion 641 includes an internal thread groove. The head portion 642 is a flat plate with an outer contour larger than that of the sleeve portion 641. The nut 64 runs through the end of the cantilever section 612 away from the fixed section 611 through the sleeve portion 641 in a displaceable manner. After the locking member 63 runs through the circuit board 50 and is locked the sleeve portion 641 of the nut 64, the nut 64 abuts against the heat conduction plate 45 and the combination member 61 with the head portion 642. In these embodiments, the second surface 452 of the heat conduction plate 45 includes a plurality of positioning grooves 4521. The position of each positioning groove 4521 corresponds to a locking position of the locking member 63. The shape of each positioning groove 4521 corresponds to that of the head portion 642 of the nut 64. In this way, each positioning groove 4521 can provide the nut 64 to be initially positioned on the heat conduction plate 45 during assembly. After the combination member 61 is fixed on the heat conduction plate 45 by the fixed section 611, the cantilever section 612 can limit the nut 64 from falling off. In this way, the displaceable configuration of the nut 64 improves the floatability of the locking member 63 after being locked on the nut 64, and can also simplify a manufacturing process of the combination member 61 and reduce production costs thereof.

In some embodiments, the nut 64 is not limited to running through the cantilever section 612 in a displaceable manner. The nut 64 may be the cantilever section 612 that only includes the sleeve portion 641 and is directly integrally formed on the combination member 61. The present invention is not limited thereto.

It should be noted that since the circuit board 50 can bear different locking pressures, to adjust a locking pressure between the combination unit 60 and the circuit board 50, the floating stroke of the cantilever section 612 can be changed accordingly by changing the material and thickness of the combination member 61 or the length of the cantilever section 612, and then the locking pressure of the locking member 63 can be relatively controlled, thereby ensuring that the circuit board 50 is kept from damage due to the excessive pressure of the locking member 63.

Referring to FIG. 3 and FIG. 4, in some embodiments, the electronic device further includes two heat dissipation fin sets 70. One heat dissipation fin set 70 is disposed in the penetrating hole 117 and is located at the first air outlet 411 of the first fan 41. The other heat dissipation fin set 70 is disposed at the second air outlet 421 of the second fan 42. In these embodiments, the end of the first heat conduction member 43 disposed at the first fan 41 abuts against the heat dissipation fin set 70 located at the first air outlet 411. The end of the second heat conduction member 44 disposed at the second fan 42 abuts against the heat dissipation fin set 70 located at the second air outlet 421. In this way, heat dissipation efficiency is improved through the configuration of the heat dissipation fin set 70.

Figure 9:
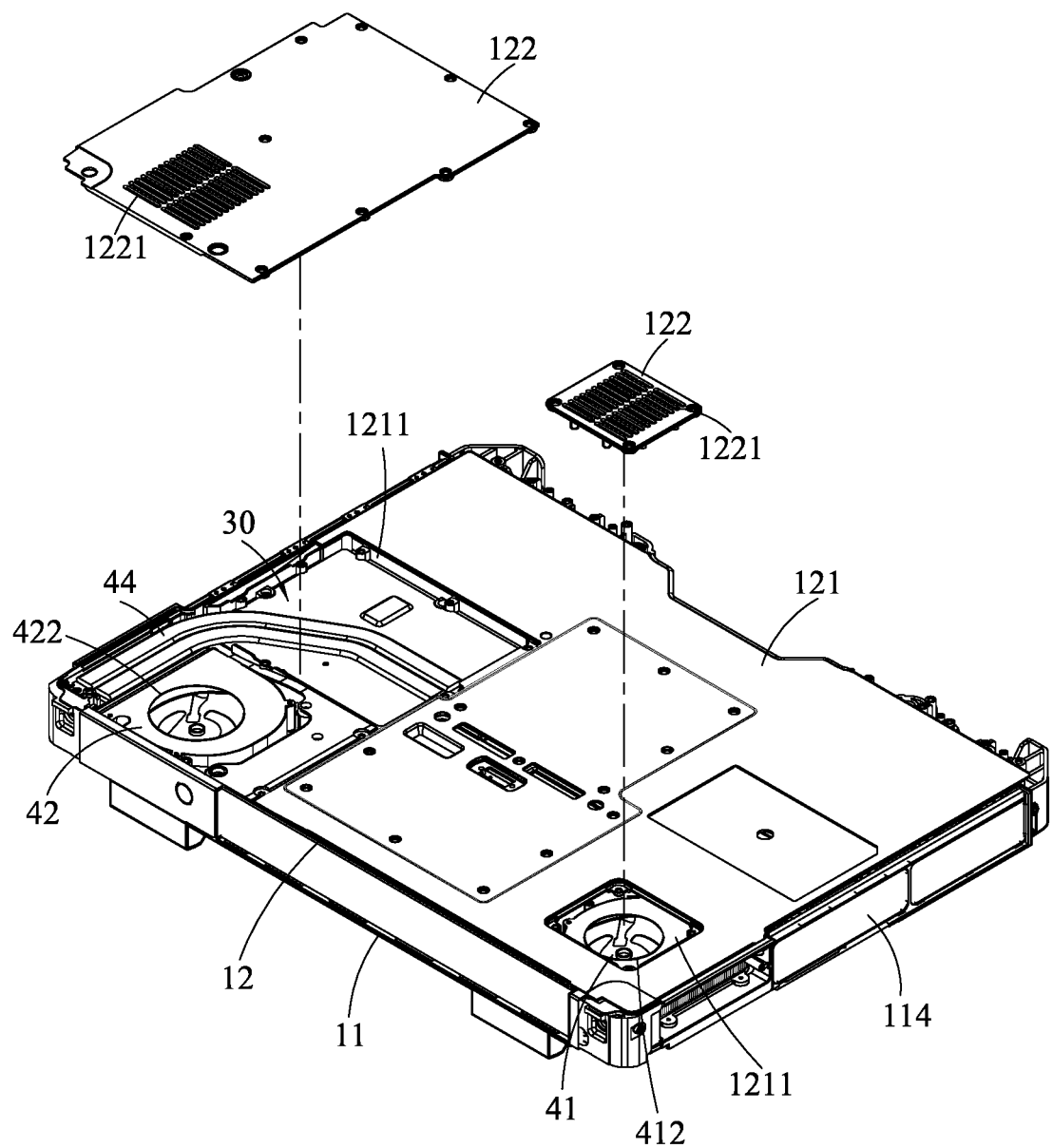
FIG. 9 is a schematic three-dimensional outside view of an embodiment of an electronic device from another perspective according to the present invention.

Referring to FIG. 9, in this embodiment, the second case 12 includes a main frame 121 and a plate member 122. The main frame 121 is disposed on the side wall 114. The plate member 122 is detachably disposed on the main frame 121. In this way, through the plate member 122 which is detachable, it is convenient for a user to replace or repair electronic parts in the housing 10 after removing the plate member 122. In these embodiments, the main frame 121 is a plate-shaped structure with an outer contour corresponding to the contour of the side wall 114 to be assembled on the side wall 114. The main frame 121 has a plurality of assembly openings 1211. The positions and shape of the assembly openings 1211 correspond to various electronic parts in the housing 10. The plate member 122 is detachably assembled in the assembly openings 1211, so that it is convenient for a user to disassemble the plate member 122 to replace or repair various components in the housing 10.

Referring to FIG. 9, in some embodiments in which the second case 12 includes the plate member 122 which is detachable, a plurality of plate members 122 may be provided. The positions of the plate members 122 may respectively correspond to the positions of the first fan 41, the second fan 42, and the second heat source 30, so as to facilitate the repair or replacement of the first fan 41, the second fan 42, or the second heat source 30.

Referring to FIG. 3 and FIG. 9, in some embodiments in which the position of the plate member 122 corresponds to that of the first fan 41 or the second fan 42. Each plate member 122 further includes a plurality of heat dissipation holes 1221. The heat dissipation holes 1221 of the plate members 122 can serve as a flow path for air to enter the housing 10 and ensure that the first fan 41 or the second fan 42 can smoothly suck outside air for heat dissipation. In these embodiments, the first fan 41 and the second fan 42 are centrifugal fans. The first fan 41 includes a first air inlet 412. The opening directions of the first air inlet 412 and the first air outlet 411 are perpendicular to each other. The second fan 42 includes a second air inlet 422. The opening directions of the second air inlet 422 and the second air outlet 421 are perpendicular to each other. In this way, the first air inlet 412 of the first fan 41 and the second air inlet 422 of the second fan 42 may correspond to the positions of the heat dissipation holes 1221 in the plate member 122 of the second case 12. The first air outlet 411 and the second air outlet 421 can correspond to the positions of the air flow channels 116 in the side wall 114 of the first case 11, so as to ensure smooth airflow into and out of the first fan 41 and the second fan 42, thereby ensuring a heat dissipation effect.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An electronic device, comprising:
    a housing, comprising:
        a first case, comprising an upper surface and a lower surface that are opposite to each other, a through hole, and a side wall, wherein the through hole runs through the upper surface and the lower surface, and the side wall extends away from the upper surface along a contour of the lower surface; and
        a second case, disposed at an end of the side wall away from the upper surface;
    a first heat source, disposed in the housing and corresponding to the through hole;
    a second heat source, disposed in the housing; and
    a heat dissipation module, comprising:
        a first fan, comprising a first air outlet, wherein the first fan is disposed on one side of the first case;
        a second fan, comprising a second air outlet, wherein the second fan is disposed on another side of the first case and is adjacent to the second heat source, and the first air outlet and the second air outlet are located on two opposite sides of the side wall;
        a first heat conduction member, having one end disposed at the first fan and another end located at a position on a side of the upper surface corresponding to the first heat source; and
        a second heat conduction member, having one end disposed at the second fan and another end located on a side of the lower surface and abutting against the second heat source.

2. The electronic device according to claim 1, wherein the first case further comprises two partition walls, the two partition walls are disposed on the lower surface and define two non-waterproof areas and one waterproof area with the side wall respectively, and both the first heat source and the second heat source are located in the waterproof area.

3. The electronic device according to claim 2, wherein the first fan and the second fan are respectively located in the two non-waterproof areas.

4. The electronic device according to claim 1, wherein the first case further comprises a penetrating hole and a groove, the penetrating hole runs through the upper surface and the lower surface, the groove is provided in the upper surface and is in communication with the penetrating hole and the through hole, the first heat conduction member is disposed in the groove, a position of the one end of the first heat conduction member corresponds to the penetrating hole, and another end is located in the through hole.

5. The electronic device according to claim 4, further comprising two heat dissipation fin sets, wherein one heat dissipation fin set is disposed in the penetrating hole and is located at the first air outlet of the first fan, and the other heat dissipation fin set is disposed at the second air outlet of the second fan.

6. The electronic device according to claim 5, wherein the one end of the first heat conduction member disposed at the first fan abuts against the one heat dissipation fin set, and the one end of the second heat conduction member disposed at the second fan abuts against the other heat dissipation fin set.

7. The electronic device according to claim 1, wherein the second case comprises a main frame and a plate member, the main frame is disposed on the side wall, and the plate member is detachably disposed on the main frame.

8. The electronic device according to claim 7, wherein a position of the plate member corresponds to a position of the first fan.

9. The electronic device according to claim 7, wherein a position of the plate member corresponds to positions of the second heat source and the second fan.

10. The electronic device according to claim 7, wherein the plate member is provided with a plurality of heat dissipation holes.

11. The electronic device according to claim 1, further comprising an input device, wherein the input device is disposed on the upper surface and covers the first heat source and the first heat conduction member.

12. The electronic device according to claim 1, further comprising a circuit board, wherein the first heat source and the second heat source are respectively located on two opposite sides of the circuit board.

13. The electronic device according to claim 12, wherein the heat dissipation module further comprises a heat conduction plate, the heat conduction plate comprises a first surface and a second surface opposite the first surface, the heat conduction plate is disposed in the through hole, the first heat conduction member abuts against the first surface, and the first heat source abuts against the second surface.

14. The electronic device according to claim 13, further comprising a combination unit, wherein the circuit board is combined with the heat conduction plate through the combination unit.

15. The electronic device according to claim 14, wherein the combination unit comprises a combination member and a locking member, the combination member comprises a fixed section and a cantilever section that are joined, the fixed section is fixed on the second surface, and the locking member runs through the circuit board and is locked on the cantilever section.

16. The electronic device according to claim 15, wherein the combination unit further comprises a nut, disposed at an end of the cantilever section away from the fixed section, and the locking member runs through the circuit board and is locked on the nut.

17. The electronic device according to claim 15, wherein the combination member has a long strip structure, and the combination member comprises two cantilever sections, respectively joined to two ends of the fixed section.

18. The electronic device according to claim 17, wherein a number of the combination member is two, and the two combination members are disposed in parallel on the heat conduction plate.

19. An electronic device, comprising:
a housing;
a circuit board, disposed in the housing;
a first heat source, disposed on the circuit board;
a heat dissipation module, comprising:
a first fan, disposed in the housing;
a heat conduction plate, comprising a first surface and a second surface opposite the first surface, wherein the second surface abuts against the first heat source; and
a first heat conduction member, having one end disposed at the first fan and another end abutting against the first surface of the heat conduction plate; and
a combination unit, comprising:
a combination member, comprising a fixed section and a cantilever section that are joined, wherein the fixed section is fixed on the second surface of the heat conduction plate; and
a locking member, running through the circuit board and locked on the cantilever section.

20. The electronic device according to claim 19, wherein the combination unit further comprises a nut, disposed at an end of the cantilever section away from the fixed section, and the locking member runs through the circuit board and is locked on the nut.

* * * * *